(12) United States Patent
van der Meulen et al.

(10) Patent No.: US 7,894,657 B2
(45) Date of Patent: Feb. 22, 2011

(54) WAFER CENTER FINDING

(75) Inventors: Peter van der Meulen, Newburyport, MA (US); Forrest T. Buzan, Dunstable, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 553 days.

(21) Appl. No.: 12/032,341

(22) Filed: Feb. 15, 2008

(65) Prior Publication Data

US 2008/0147333 A1 Jun. 19, 2008

Related U.S. Application Data

(63) Continuation of application No. 11/682,306, filed on Mar. 5, 2007, now Pat. No. 7,792,350, which is a continuation-in-part of application No. 11/679,829, filed on Feb. 27, 2007, now abandoned, and a continuation-in-part of application No. 10/985,834, filed on Nov. 10, 2004, now Pat. No. 7,458,763.

(60) Provisional application No. 60/777,443, filed on Feb. 27, 2006, provisional application No. 60/518,823, filed on Nov. 10, 2003, provisional application No. 60/607,649, filed on Sep. 7, 2004, provisional application No. 60/779,684, filed on Mar. 5, 2006, provisional application No. 60/779,707, filed on Mar. 5, 2006, provisional application No. 60/779,478, filed on Mar. 5, 2006, provisional application No. 60/779,463, filed on Mar. 5, 2006, provisional application No. 60/779,609, filed on Mar. 5, 2006, provisional application No. 60/784,832, filed on Mar. 21, 2006, provisional application No. 60/746,163, filed on May 1, 2006, provisional application No. 60/807,189, filed on Jul. 12, 2006, provisional application No. 60/823,454, filed on Aug. 24, 2006.

(51) Int. Cl.
*G06K 9/00* (2006.01)
(52) U.S. Cl. ........................ 382/141; 382/151
(58) Field of Classification Search ................. 382/141, 382/151, 153, 288, 291, 145; 348/86; 702/150; 700/245
See application file for complete search history.

(56) References Cited

U.S. PATENT DOCUMENTS

| 4,819,167 A | * | 4/1989 | Cheng et al. | ................ 700/59 |
| 5,546,179 A | * | 8/1996 | Cheng | .......................... 356/73 |
| 5,917,601 A | * | 6/1999 | Shimazaki et al. | .......... 356/622 |

* cited by examiner

*Primary Examiner*—Daniel G Mariam
(74) *Attorney, Agent, or Firm*—Perman & Green, LLP; Richard Pickreign

(57) ABSTRACT

A number of wafer center finding methods and systems are disclosed herein that improve upon existing techniques used in semiconductor manufacturing.

20 Claims, 11 Drawing Sheets

WAFER CENTER FINDING

CROSS-REFERENCE TO RELATED APPLICATIONS

This application is a continuation of U.S. application Ser. No. 11/682,306 filed on Mar. 5, 2007 (which is now U.S. Pat. No. 7,792,350).

The '306 application is a continuation-in-part of U.S. application Ser. No. 11/679,829 filed on Feb. 27, 2007 (which is now abandoned), which claims the benefit of U.S. Prov. App. No. 60/777,443 filed on Feb. 27, 2006 and is a continuation-in-part of U.S. application Ser. No. 10/985,834 filed on Nov. 10, 2004 (which is now U.S. Pat. No. 7,458,763), which claims the benefit of U.S. Prov. App. No. 60/518,823 filed on Nov. 10, 2003 and U.S. Prov. App. No. 60/607,649 filed on Sep. 7, 2004.

The '306 application also claims the benefit of the following U.S. applications: U.S. Prov. App. No. 60/779,684 filed on Mar. 5, 2006; U.S. Prov. App. No. 60/779,707 filed on Mar. 5, 2006; U.S. Prov. App. No. 60/779,478 filed on Mar. 5, 2006; U.S. Prov. App. No. 60/779,463 filed on Mar. 5, 2006; U.S. Prov. App. No. 60/779,609 filed on Mar. 5, 2006; U.S. Prov. App. No. 60/784,832 filed on Mar. 21, 2006; U.S. Prov. App. No. 60/746,163 filed on May 1, 2006; U.S. Prov. App. No. 60/807,189 filed on Jul. 12, 2006; and U.S. Prov. App. No. 60/823,454 filed on Aug. 24, 2006.

All of the foregoing applications are commonly owned, and all of the foregoing applications are incorporated herein by reference in their entirety.

BACKGROUND

In semiconductor manufacturing, wafers and other substrates are transferred among various process chambers using robotic handlers. One of the enduring challenges of wafer handling is the need to locate wafers or wafer centers with sufficient precision to permit accurate placement and processing within the process chambers. In general, semiconductor manufacturing systems employ various beam-breaking sensor arrangements to "stripe" passing wafers and detect the wafer edges. This data can be used, in turn to locate a wafer center relative to a robotic handler so that subsequent movement and placement can be more accurately controlled. Center finding is sufficiently important to fabrication that this process is routinely calibrated and repeated throughout the processing of each wafer.

While numerous physical sensors and processing algorithms have been devised for centering wafers in a semiconductor manufacturing process, there remains a need for improved wafer center finding techniques that reduce the number of sensors required or improve the simplicity and/or accuracy of center finding calculations.

SUMMARY

A number of wafer center finding methods and systems are disclosed herein that improve upon existing techniques used in semiconductor manufacturing.

In one aspect, a method for finding a center of a wafer in a device having an interior and a plurality of entrances, the interior containing a robotic arm, and the device including a plurality of sensors, each one of the sensors adapted to detect a presence of the wafer at a predetermined location within the interior of the device, includes: retrieving the wafer from outside the interior through a first one of the plurality of entrances; retracting the wafer into the interior and detecting a presence of the wafer with a first one of the plurality of sensors; rotating the robotic arm; extending the wafer out of the interior through a second one of the plurality of entrances and detecting an absence of the wafer with the first one of the plurality of sensors; and determining a location of a center of the wafer relative to the robotic arm using sensor data from the plurality of sensors and position data from the robotic arm.

The plurality of sensors may include optical sensors. The plurality of sensors may include light emitting diodes. The plurality of sensors may include auto focusing photodiode detectors. Determining a location may include applying a Kalman Filter to the position data from the robotic arm. The method may include updating the Kalman Filter based upon the sensor data. The wafer may be substantially circular. The wafer may include an alignment notch. The plurality of sensors may include at least one detector positioned opposite a light emitting diode such that a light path from the light emitting diode to the light detector includes a predetermined position within the interior. The plurality of sensors may include at least one detector positioned such that light from a light emitting diode, when reflected off of the wafer at a predetermined location, is detected by the detector. Retracting may include may include retracting in a linear motion. Extending may include extending in a linear motion. Rotating may include rotating about a center axis of the robotic arm.

In another aspect, a method disclosed herein for finding a center of a wafer in a device having an interior and a plurality of entrances, the interior containing a robotic arm, and the device including a plurality of sensors, each one of the sensors adapted to detect a presence of the wafer at a predetermined location within the interior of the device, includes: retrieving the wafer from outside the interior through a first one of the plurality of entrances; retracting the wafer into the interior; rotating the robotic arm; extending the wafer out of the interior through a second one of the plurality of entrances; detecting the presence of the wafer at a predetermined location of at least one sensor during the retracting, rotating, and extending, thereby providing sensor data; and determining a location of a center of the wafer relative to the robotic arm using the sensor data and position data from the robotic arm.

The plurality of sensors may include optical sensors. The plurality of sensors may include light emitting diodes. The plurality of sensors may include auto focusing photodiode detectors. Determining a location may include applying a Kalman Filter to the position data from the robotic arm. The method may include updating the Kalman Filter based upon the sensor data. The wafer may be substantially circular. The wafer may include an alignment notch. The plurality of sensors may include at least one detector positioned opposite a light emitting diode such that a light path from the light emitting diode to the light detector includes a predetermined position within the interior. The plurality of sensors may include at least one detector positioned such that light from a light emitting diode, when reflected off of the wafer at a predetermined location, is detected by the detector. Retracting may include retracting in a linear motion. Extending may include extending in a linear motion. Rotating about a center axis of the robotic arm. Detecting the presence of the wafer may include detecting a first transition from absence to presence of the wafer at one of the plurality of sensors and detecting a second transition from presence to absence of the wafer at the one of the plurality of sensors, wherein a path of the wafer from the first transition to the second transition is non-linear. The path may include at least one arc resulting from a rotation of the wafer.

In another aspect, a device for handling a wafer disclosed herein includes: an interior accessible through a plurality of entrances; and a plurality of sensors consisting of two sensors for each one of the plurality of entrances, each sensor capable of detecting a presence of a wafer at a predetermined location within the interior, wherein the plurality of sensors are arranged so that at least two of the plurality of sensors detect the wafer for any position of the wafer entirely within the interior.

The plurality of entrances may include four entrances. The plurality of entrances may include seven entrances. The plurality of entrances may include eight entrances. The plurality of sensors may include optical sensors. The plurality of sensors may include at least one light emitting diode. The device may include a robotic arm having a center axis within the interior, the robotic arm including an end effector for handling wafers.

In another aspect a device for handling a wafer disclosed herein includes: an interior accessible through a plurality of entrances; and a plurality of sensors consisting of two sensors for each one of the plurality of entrances, each sensor capable of detecting a presence of a wafer at a predetermined location within the interior, wherein the plurality of sensors are arranged so that a first pair of sensors detect a wafer entering linearly through each one of the plurality of entrances and a second pair of sensors are positioned substantially immediately outside the maximum diameter of the wafer entering linearly through each one of the plurality of entrances, and wherein each one of the plurality of entrances shares one of the first pair of sensors and the second pair of sensors with each neighboring one of the plurality of entrances.

The plurality of entrances may include four entrances. The plurality of entrances may include seven entrances. The plurality of entrances may include eight entrances. The plurality of sensors may include optical sensors. The plurality of sensors may include at least one light emitting diode. The device may include a robotic arm having a center axis within the interior, the robotic arm including an end effector for handling wafers.

In another aspect, a device for handling a wafer disclosed herein includes: an interior accessible through four entrances; and eight sensors, each capable of detecting a presence of a wafer at a predetermined location within the interior, the sensors arranged into two square arrays centered about a center of the interior, sized such that a first one of the square arrays is smaller than a second one of the square arrays and oriented so that a group of four of the sensors at opposing vertices of the two square arrays are collinear.

The eight sensors may include optical sensors. The eight sensors may include at least one light emitting diode. The device may include a robotic arm having a center axis within the interior, the robotic arm including an end effector for handling wafers.

In another aspect, a device disclosed herein may include a robotic arm for handling a wafer, the robotic arm including one or more encoders that provide encoder data identifying a position of one or more components of the robotic arm; and a processor adapted to apply an extended Kalman Filter to the encoder data to estimate a position of the wafer.

The position may include a wafer center and/or a wafer radius. The position may be determined with reference to an end effector of the robotic arm. The position may be determined with reference to a center axis of the robotic arm. The processor may recalculate the position each time new encoder data is received. The new encoder data may be received at substantially 2 kHz. The processor may be adapted to update one or more equations of the Kalman Filter using transition data from one or more sensors that detect the presence of a wafer at one or more predetermined locations within a robotic wafer handler.

In another aspect, a method disclosed herein includes disposing a plurality of sensors within an interior of a wafer handling device, each one of the plurality of sensors capable of detecting a transition between presence and absence of a wafer at a predetermined location within the interior; handling a wafer with a robotic arm, the robotic arm including one or more encoders that provide encoder data identifying a position of one or more components of the robotic arm; and applying the encoder data to an extended Kalman Filter to provide an estimated position of the wafer.

The method may include detecting a transition at one of the plurality of sensor to provide an actual position of the wafer; determining an error between the actual position and the estimated position; and updating one or more variables for the extended Kalman Filter based upon the error. Applying the encoder data may include calculating a wafer position every 0.5 milliseconds. The estimated position of the wafer may include a center of the wafer. The estimated position of the wafer may include a radius of the wafer.

In another aspect, a device disclosed herein may include an interior chamber having a plurality of entrances shaped and sized for passage of at least one wafer; a contact image sensor positioned to scan a wafer within the interior; a robot within the interior including an end effector for handling the wafer, the robot configured to move the wafer within a measurement volume of the contact image sensor thereby obtaining an image of at least a portion of the wafer; and a processor configured to process the image and determine a center of the wafer.

The robot may move the wafer linearly through the measurement volume of the contact image sensor. The contact image sensor may be oriented normal to a path of the wafer. The contact image sensor may be oriented at a forty-five degree angle to a path of the wafer. The robot may move the wafer in a curved path through the measurement volume of the contact image sensor. The robot may move the wafer in a discontinuous path through the measurement volume of the contact image sensor. The robot may rotate the wafer within the measurement volume of the contact image sensor. The robot may be adapted to lift the wafer into the measurement volume of the contact image sensor. The robot may include a rotating chuck on an end effector adapted to rotate the wafer. The rotating chuck may rotate between one-hundred eighty degrees and three-hundred sixty degrees. The device may include a rotating chuck adapted to lift the wafer from the end effector into the measurement volume of the contact image sensor. The contact image sensor may be at least 300 mm in length. The contact image sensor may have a length exceeding a diameter of the wafer. The contact image sensor may be positioned at one of the plurality of entrances to the interior. The device may include a plurality of contact image sensors, each one of the plurality of contact image sensors place at one of the plurality of entrances to the interior. The contact image sensor may be placed to intersect a center of the interior. The device may include a second contact image sensor, wherein the contact image sensor and the second contact image sensor are positioned collinearly. The contact image sensor and the second contact image sensor may be positioned at one of the plurality of entrances to the interior. The device may include a plurality of pairs of collinear contact image sensors positioned at each one of the plurality of entrances to the interior. The device may include a second pair of collinear contact image sensors, wherein the second pair of collinear contact image sensors are positioned to intersect a center of the interior. The plurality of entrances may include four entrances. The plurality of entrances may include eight entrances. The processor may be further configured to identify an alignment notch on the wafer. The processor may be further configured to determine a radius of the wafer.

In another aspect, a method may include positioning a contact image sensor to capture image data from the interior of a robotic wafer handler; passing at least a portion of a wafer by the contact image sensor to acquire an image; and determining a center of the wafer based upon the image. Passing at least a portion of the wafer by the contact image sensor may include passing the wafer linearly through a measurement volume of the contact image sensor.

In another aspect, a device disclosed herein includes a robotic arm within a robot chamber, the robotic arm including an end effector adapted to handle a wafer; and a linear array of charge-coupled devices within the interior of the robot chamber, the linear array positioned to acquire image data from a measurement volume in one or more predetermined locations within the robot chamber.

The device may include an external illumination source that illuminates the linear array. The device may include a wireless power coupling that inductively powers the linear array. The device may include a wireless transceiver for exchanging data wirelessly with the linear array. The wireless transceiver may be positioned outside the robotic chamber. The data may include the image data. The linear array may be a 1 by n array of charge-coupled devices. The linear array may include a two dimensional array of charge-coupled devices. The device may include a plurality of linear arrays each capturing image data at a different location within the interior. The robotic arm may include a chuck on the end effector adapted to rotate the wafer within the measurement volume of the linear array. The robotic arm may be adapted to lift the wafer into the measurement volume of the linear array. The chuck may rotate between one-hundred eighty degrees and three-hundred sixty degrees. The device may include a rotating chuck adapted to lift the wafer from the end effector into the measurement volume of the linear array. The device may include a processor configured to determine a center of the wafer using the image data. The device may include a processor configured to determine a radius of the wafer using the image data. The device may include a processor configured to identify an alignment notch on the wafer using the image data.

In another aspect, a device disclosed herein may include a robotic arm within a robot chamber, the robotic arm including an end effector adapted to handle a wafer; and a linear array of charge-coupled devices on the end effector positioned to capture edge data from a wafer resting on the end effector.

The device may include an external illumination source that illuminates the linear array. The device may include a wireless power coupling that inductively powers the linear array. The device may include a wireless transceiver for exchanging data wirelessly with the linear array. The wireless transceiver may be positioned outside the robotic chamber. The linear array may be a 1 by n array of charge-coupled devices. The linear array may include a two dimensional array of charge-coupled devices. The robotic arm may include a chuck on the end effector adapted to rotate the wafer within the measurement volume of the linear array. The device may include a rotating chuck adapted to lift the wafer from the end effector and rotate the wafer within the measurement volume of the linear array. The device may include a processor configured to determine a center of the wafer using the edge data. The device may include a processor configured to determine a radius of the wafer using the edge data. The device may include a plurality of linear arrays positioned to capture edge data from a number of locations on a surface of the end effector.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures.

DETAILED DESCRIPTION

The following description focuses on finding the center of substantially circular semiconductor substrates with alignment notches. However, it will be understood that suitable adaptations may be made to many of the techniques described below for finding centers of other geometries such as ovals, half-circles, squares, rectangles, and so forth. It will further be understood that, while semiconductor fabrication is an important field for use of the techniques described herein, that the center finding techniques discussed below have broad applicability, and may be used for example in a wide range of machine vision and robotics applications.

The term "wafer" as used herein is a short hand for all substrates and other materials that might be handled by a semiconductor fabrication system. It will be understood that, while the following description is applicable to wafers, and refers specifically to wafers in a number of illustrative embodiments, a variety of other objects may be handled within a semiconductor facility including a production wafer, a test wafer, a cleaning wafer, a calibration wafer, or the like, as well as other substrates (such as for reticles, magnetic heads, flat panels, and the like), including substrates having various shapes such as square or rectangular substrates. All such workpieces are intended to fall within the scope of the term "wafer" as used herein unless a different meaning is explicitly provided or otherwise clear from the context.

Figure 1:
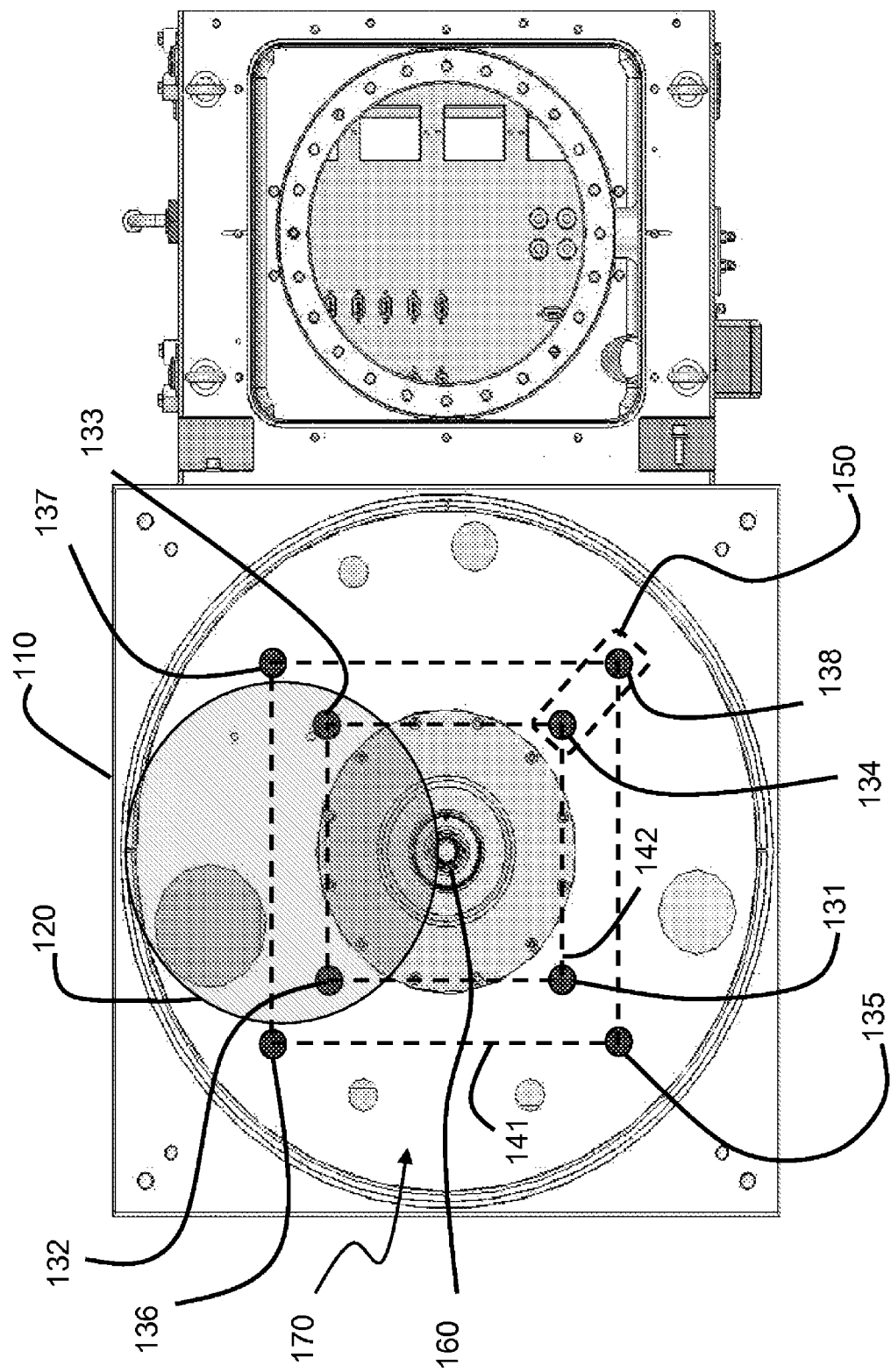
FIG. 1 shows a top view of a wafer handling module with eight sensors for detecting the position of a wafer.

FIG. 1 shows a top view of a transfer robot handling module. In the module 110, a substantially round wafer 120 may be handled by a robot (not shown) having a center axis 160 while sensors detect the presence (or absence) of the wafer 120. In general, the module 110 may have a substantially circular interior 170 with a radius sufficient to accommodate rotational movement of a wafer and the robot among various entrances (not shown) to the module 110. While additional void space may be provided, and the shape may have any geometry that can accommodate movement of wafers, the generally circular shape provides a significant advantage of minimizing volume within the vacuum environment maintained by the module 110 and other related hardware.

Also in general, two or more entrances may be provided to the module 110 shaped and sized for passage of the wafer 120, along with any portions of the robotic arm required to place and retrieve the wafer 120 outside the module 110. In general the size of each entrance would be only wide enough and tall enough to accommodate a single wafer, along with an end effector and any other portions of the robot that must pass through the entrance during handling. This size may be optimized by having the robot move wafers straight through a center of each entry, which advantageously conserves valuable volume within the vacuum environment. Semiconductor wafers are generally substantially circular as provided by industry standards. Such wafers may also include an alignment notch for preserving a rotational alignment of the wafers during processing, and identifying or accounting for this notch may require additional processing during wafer center finding, as described in greater detail below. However, more generally a wafer may have a variety of shapes and/or sizes. For example, while 300 mm is a conventional size for current wafers, new standards for semiconductor manufacturing provide for wafers over 400 mm in size. Further, certain substrates have other shapes, such as rectangular substrates employed for flat panels. Thus it will be understood that the shape and size of components (and voids) designed for wafer handling may vary, and one skilled in the art would understand how to adapt components such as the entrances to particular wafer dimensions.

In one embodiment, the module 110 may include four entrances, one on each side of the module 100. The module 110 may also include a different number of entrances such as two or three. Further, while a square module 110 is depicted, the module 110 may have other shapes (such as commonly used in cluster processing), such as a rectangle or a regular polygon such as a hexagon, heptagon, octagon, or the like. A rectangular shape may have multiple entrances on one side, and the regular polygons may include an entrance on each side. Thus it will be understood that while a square module 110 having an entrance on each side is a common arrangement useful for semiconductor manufacturing, many other shapes may be suitably adapted for use in a fabrication facility and are intended to fall within the scope of this disclosure.

As depicted, the sensors may include eight sensors 131-138 arranged as two square arrays 141, 142 centered about the center axis 160 of the robot. The sensors are arranged to that four of the sensors 131-134 form a first, inner array 142 while four of the sensors 135-138 form a second, outer array 141. While the layout of these sensors is best understood with reference to FIG. 1, other features of the layout are described as follows. The two concentric square arrays 141, 142 are oriented so that the vertices form pairs 150 of sensors from the inner array 142 and outer array 141. The arrays 141, 142 are further rotationally oriented so that four such sensor from opposing vertices of the two square arrays 141, 142 are collinear, forming a line that intersects a center of the interior 170 or the center axis 160 of the robot. This last constraint is not strictly necessary—the robot may have more than one axis, and the robot may be adapted for a variety of rotational movements that would not require an axis at the center of the interior 170. However, it is a convenient and practical layout for a robotic handler that provides three-hundred and sixty degree freedom of motion. It will also be noted that when the wafer 120 first enters (or exits) the interior 170 from one of the entrances, which are generally centered on each side, two sensors from the inner array 142 can detect the wafer, and two sensors from the outer array 141 are positioned immediately outside a diameter of the wafer 120 on either side. In this manner, it can be ensured that, while maintaining a ratio of only two sensors for each entrance, at least two sensors detect the wafer 120 at all times while the wafer 120 is within the interior 170, and at least one sensor will immediately detect any rotational movement of the wafer 120 within the interior 170. As a significant advantage, this configuration also ensures that it is always possible to detect the presence of a wafer within the interior, even if the module 110 and sensors 131-138 are powered up, for example after a power failure, with no a priori data concerning wafer position.

A similar arrangement may be provided for a module having five, six, seven, eight, or more entrances. In general, each entrance may have two sensor on each side, where a first sensor is positioned to detect a wafer when it has been moved entirely into the interior from the entrance and a second sensor is positioned immediately outside the diameter of the wafer. In such embodiments, each pair of sensors from an inner and outer array may be shared with a neighboring entrance, that is, an immediately adjacent entrance on either side thereof.

While FIG. 1 depicts a specific arrangement of sensors 131-138, other criteria may be used to determine suitable sensor numbers and placement. For example, sensor placement may advantageously provide at least four points around the circumference of the wafer during any move sequence where the wafer is retrieved from a station and placed into another station. Any group of three points used to estimate the center and radius may usefully contain more than sixty degrees between the at least three points, less than one-hundred eighty degrees between any three points used to define a center and radius (i.e., no section of one-hundred sixty degrees should lack a point defining its edge. Extra points may advantageously be employed to improve an estimate through direct calculation or to validate a calculate circle. Sensors may advantageously be positioned within the swing radius of links of a robotic arm, along with a fiducial marking that can reliably and repeatably trigger the sensors.

Sensor arrangements may also be adapted to specific end effectors. For example, fork-type end effectors support a wafer around the side edges, but not the front. For conventional wafer sizes, this leaves a 250 mm wide area in the middle of a fork; however, none of the side edge may be used for detection. For a paddle-type end effector, a center 150 mm, straddling a center line of linear extension is open for sensor positioning, but the back end of the wafer, toward the wrist of the robotic arm, may be completely blocked from the sensor by the end-effector.

The sensors 131-138 generally operate to detect the presence of a wafer at a predetermined position within the interior 170. It will be understood that, as used herein, detecting a presence includes detecting an absence as well as detecting a transition between absence and presence of a wafer. A number of technologies may be suitably employed for this type of detection including optical sensors such as reflective technologies where a light source is reflected back toward a source when a wafer is present or beam-breaking technologies where a beam between a light source and a sensor is broken when a wafer is present. In one embodiment, the sensors 131-138 employ a light-emitting diode or laser light source with light directed toward an auto focusing photodiode detector (which facilitates alignment during installation). It will be understood that while the sensors described above are one cost effective solution for detecting the presence of a wafer at predetermined locations, other sensing technologies may be similarly employed provided they can be adapted to vacuum semiconductor environments. This may include, for example, sonar, radar, or any other electromagnetic or other distance or position sensing technology.

The distance between the inner array 142 and the outer array 141, or each pair of sensors 150 therein, will generally be determined by the size of wafers handled by the system. In one embodiment, the positions of sensors may be adjustable to form larger or smaller arrays while maintaining the linear and diagonal relationships discussed above. In this manner, the module 110 may be readily adapted to wafers of different sizes.

In general operation, the sensors 131-138 are employed to determine a location of a center of the wafer 120, using circular models, linear models (such as the Kalman Filter technique described below), or any other suitable mathematical, neural network, heuristic, or other technique. Methods for detecting wafer position and center are now described in greater detail. In general, the following techniques employ a combination of data from the sensors 131-138 and data from encoders for one or more robotic handlers that provide data concerning a position of robotic components. While the following description focuses on sensor and encoder data, it will be understood that time, as detected by any clock or signal within the system, may also be used explicitly or implicitly in wafer center finding calculations.

Figure 2:
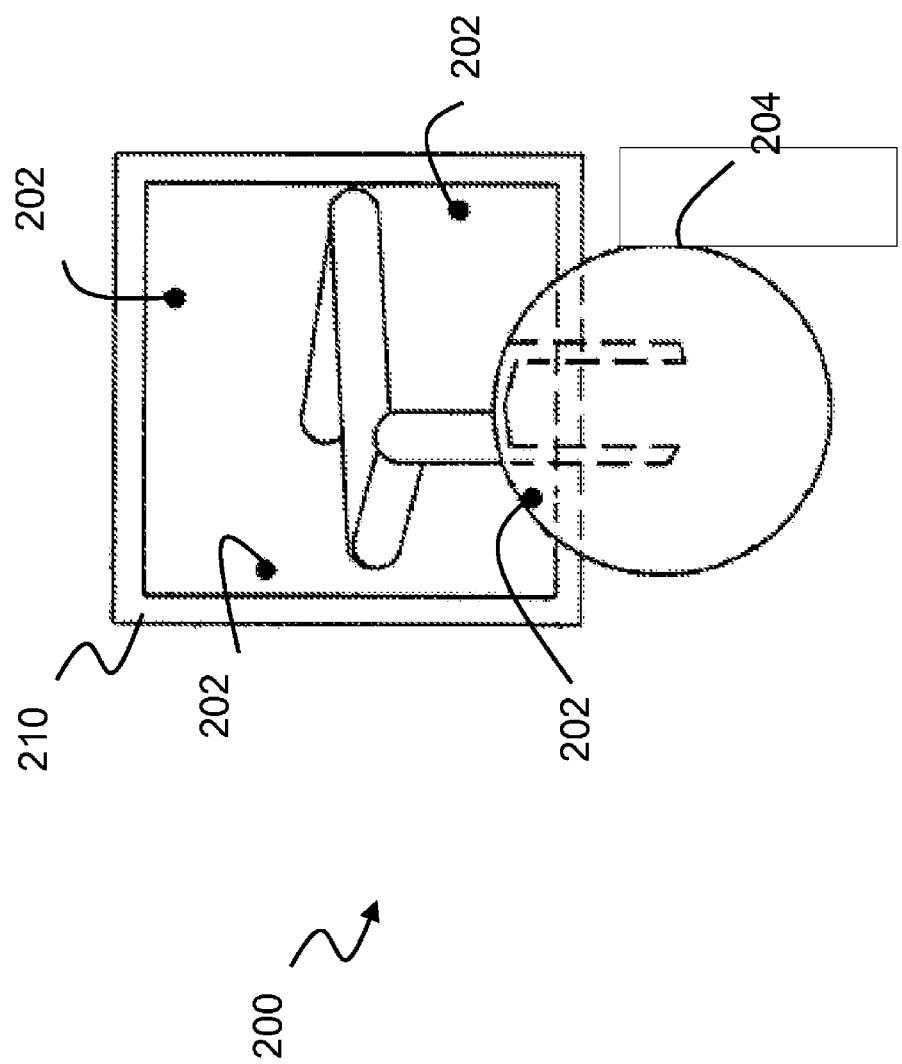
FIG. 2 shows a top view of a wafer handling module with four sensors for detecting the position of a wafer.

FIG. 2 shows a top view of a wafer handling module with four sensors for detecting the position of a wafer. In this embodiment, the system 200 may employ only one sensor 202 for each entrance. The sensors 202 may be any of the sensors described above. In this case, the sensors 202 are preferably positioned near each entrance and inside the diameter of a wafer 204 so that at least one edge detection can be obtained as the wafer passes any one of the entrances. As depicted, the wafer handling module 210 is generally square, and includes four entrances, each having one sensor 202 associated therewith.

Figure 3:
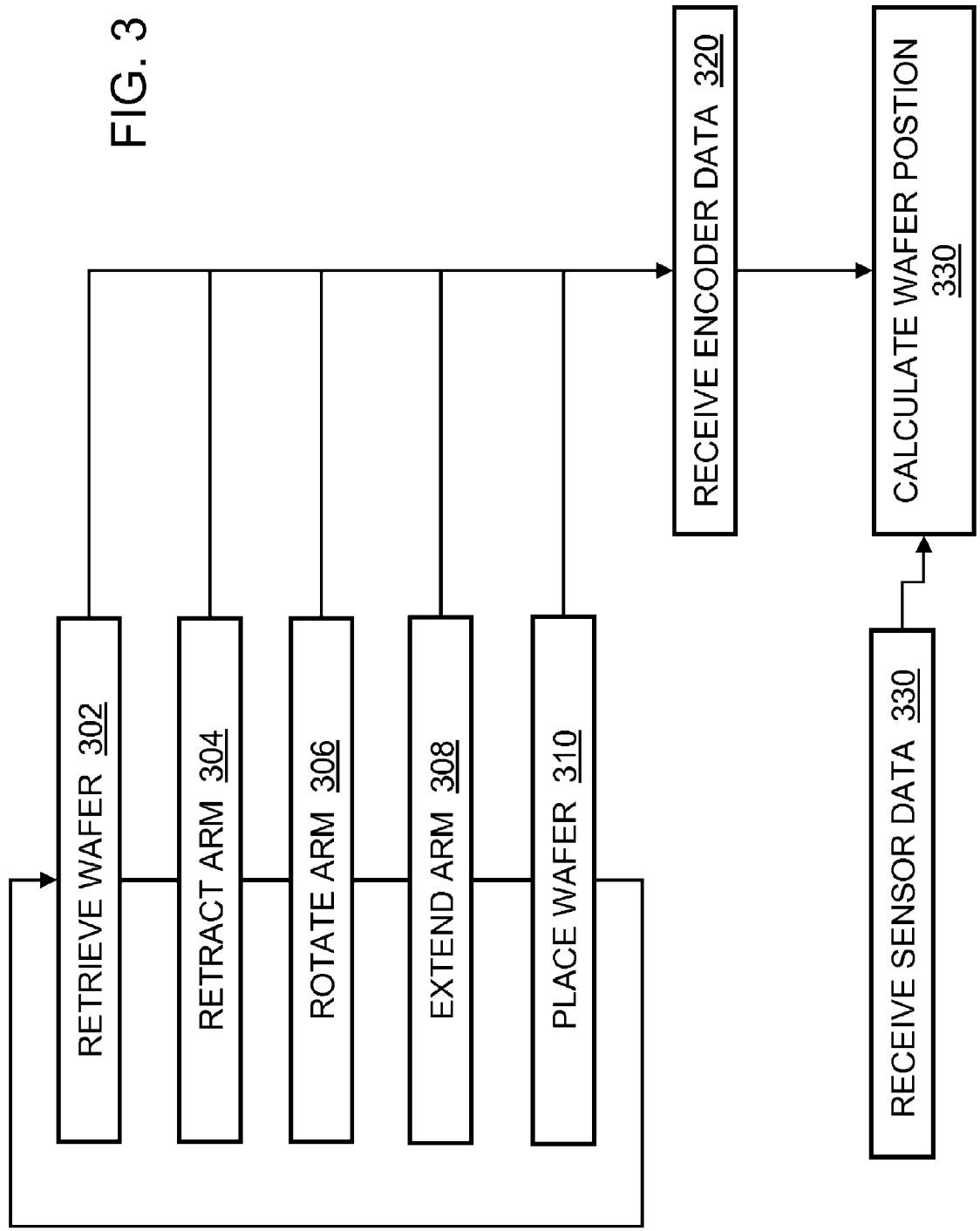
FIG. 3 illustrates a generalized process for wafer center finding.

FIG. 3 illustrates a generalized process for wafer center finding.

In general, a robotic arm, such as any of the robotic arms described above, may engage in a number of operations to transfer a wafer, such as any of the wafers described above, from one location in a semiconductor manufacturing process to another location. This includes a number of operations including retrieving a wafer from a first location as shown in step 302, retracting a robotic arm into a module such as any of the modules described above, as shown in step 304, rotating the robotic arm toward another entrance to the module as shown in step 306, extending the robotic arm through this entrance as shown in step 308, and placing a wafer in a second location as shown in step 310. The first and second locations may be any locations within a fabrication facility including other robotic handlers, load locks, buffer or transition stations, process modules of any kind, and/or other modules for supplemental processes such as cleaning, metrology, scanning, and so forth. As depicted in FIG. 3, this process may be repeated indefinitely as wafers are moved in and out of the facility and processed by various process modules. It will be understood that, while not explicitly depicted, other steps may be performed by the system during these operations, such as opening or closing isolation valves for entrances to the interior, or waiting within the interior for access to various resources. The details of various robotic handling operations are well known in the art, and any such robotic arms or handling functions may be suitably employed with the process depicted in FIG. 3. This includes various combinations of extensions, retractions, and rotations of the robotic arm, z-axis motion by the robotic arm, and any other operations that might be usefully employed in wafer handling.

While the robotic arm is being controlled in a wafer handling operation as described in steps 302, encoders provide data concerning the position of the robotic arm, either directly or by detecting positions (including rotational orientation) of drive elements that control operation of the robotic arm. This data may be received for processing as depicted in step 320. As shown in step 330, sensor data may be received from one or more sensors, such as any of the sensors described above, that detect the presence, absence, or transition between presence and absence of wafers at predetermined locations within the robotic handler. It will be understood that the physical data for such sensing may come in a variety of forms including presence of an optical signal, absence of an optical signal, strength of an optical signal, or a binary signal encoding any of the above. All such signals may usefully be employed to sense absence, presence, and transitions as described herein.

As shown in step 330, the encoder data and the sensor data may be applied to calculate position data for a wafer such as alignment, wafer center, and so forth. Details of various algorithms for calculating wafer position are now provided. While not explicitly shown, it will be understood that the controller or other device that calculates wafer position may apply this data in any of a variety of ways to control further movement of the robotic arm. In particular, this data may be used for accurate placement of the wafer at a destination location. The data may also be stored, and used as an initial estimate of wafer position when the same wafer is retrieved for an additional movement.

In the four-entrance, four-sensor embodiment of FIG. 2, wafer edge data (obtained as transitions in step 330) is used to determine a wafer center to a transport path that facilitates moving the wafer from its detected position to its destination position. The sensor position, robot position, and destination location positions (such as within a process chamber or load lock) are defined in a world coordinate system that facilitates determining the relative position of these and other elements within a wafer processing system that includes the wafer handling robotic module. The world coordinate system may advantageously be established with reference to the sensor positions.

Through training, a controller may associate robot positions or encoder data with the world coordinate system using sensor data to detect, for example, aspects of the robot end effector and recording concurrent values from the encoders. The controller may thus map encoder values to world coordinates so that as the robot moves, the world coordinate position of the robot is known. The controller may similarly determines the world coordinates of other elements (such as destinations) within the wafer processing system to create a world coordinate map of the elements of the wafer processing system. Association of robot positions with the world coordinate system may also, or instead, be done manually, with a calibrated fixture, or with an instrumented tool carried by the robot. The foregoing is provided by way of example only, and it will be understood that many techniques are known in the art for associated robotic positions with a world coordinate system and may be usefully employed with the systems described herein. For example, while a sensor-based world coordinate system is one possible approach, similar center finding functions may be performed using an end-effector-based world coordinate system.

After the robotic arm has been suitably trained, sensor data may be acquired while a wafer is handled through a retract/rotate/extend motion, as generally depicted in FIG. 3. A number of techniques may be suitable employed to determine wafer position where a wafer moves in a non-linear path over a number of sensors having predetermined location. Several such techniques are described in detail below by way of illustration and not of limitation.

To estimate the center and radius of a wafer, the world coordinate edge point data may be applied to simultaneous circle equations. These equations may be converted to matrix form and a so-called pseudo inverse may be used to provide a least squares solution to the matrix, as described for example in Linear Algebra and its Applications by Gilbert Strang (Academic Press, Inc. 1980), the entire content of which is incorporated by reference. This solution minimizes the squared error between a circle's perimeter and the detected edge points. From this solution, the center location and radius can be calculated. Stated mathematically, the general equation for a circle may be expressed as:

$$(x-x_c)^2+(y-y_c)^2=r^2$$

which may be reformulated as:

$$x^2+y^2+Dx+Ey+F=0$$

where $$D=-2x_c, E=-2y_c, F=x_c^2+y_c^2-r^2$$

Given n points from the circumference of this circle, a matrix of n equations may be formed as:

$$\begin{bmatrix} x_1 & y_1 & 1 \\ x_2 & y_2 & 1 \\ \vdots & \vdots & \vdots \\ x_i & y_i & 1 \\ \vdots & \vdots & \vdots \\ x_n & y_n & 1 \end{bmatrix} \begin{bmatrix} D \\ E \\ F \end{bmatrix} = - \begin{bmatrix} x_1^2+y_1^2 \\ x_2^2+y_2^2 \\ \vdots \\ x_i^2+y_i^2 \\ \vdots \\ x_n^2+y_n^2 \end{bmatrix}$$

$$Ax=b$$

If there are three points, then the A matrix is square, and the solution may be expressed by inverting the A matrix as follows:

$$x=A^{-1}b$$

Where more than three points are available, the pseudo inverse may be employed to provide the least squares solution to the problem as noted above. This may be states as:

$$x=(A^TA)^{-1}A^Tb$$

This solution minimizes the squared error between the circle's perimeter and all the points. From the solution for the vector, x, the center location and estimated radius may be calculated for a circular wafer from D, E, and F.

For notch detection, the distance of each detected point from the calculated center may be determined, and any point not conforming to the desired circularity (using any suitable metric) may be removed, after which the center and radius may be recalculated. An alignment notch can thus be detected in these calculations by identifying detected edge points that are off the calculated circle by more than some predetermined threshold or tolerance. For purposes of center finding, these points may be removed. General information about wafer geometry may also be employed to detect (and exclude from subsequent calculations) points that are likely associated with robotic components rather than a wafer. In one aspect, the system may discriminate between anomalies close to the expected circumference (which are likely due to an alignment notch) and anomalies that are far from the expected circumference, so that the rotational alignment of the wafer can also be recovered. In general, such discrimination may be based on the relative magnitude of the variation, as well as the general notion that an alignment notch is characterized by an unexpected absence of a wafer while the robotic arm would generally cause an unexpected presence of a wafer.

In addition, various events during movement, such as radial displacement, linear displacement, or other simple or composite motion of a wafer relative to an end effector may be detected and accounted for using techniques known to one of ordinary skill in the art.

A number of functions related to wafer detection may be usefully performed. For example, the system designed herein may calculate link offsets for a robotic arm, calibrate sensor locations, calibrate beam widths for optical sensors, calculate a wafer center position relative to an end effector, sense wafer presence at predetermined locations, determine when slot valve doors are clear or blocked, and provide for accurate placement of wafers in process modules, load locks, and other linking modules within a fabrication facility. A number of related processing examples are provided below.

Using the above techniques, as well as any other suitable center finding techniques, a robotic handler and sensors may be operated to determine wafer location. In one embodiment, the system may track sensor data during a retract (step 304) and rotate (step 306), and begin wafer center calculations upon initiation of extension (step 308). In this embodiment, after the rotation, a processor may calculate instantaneous radius and angle of the wafer center (using, for example, the least square fit described above), and calculate sensor positions, such as by transformation to a suitable global coordinate system (e.g., end effector, module, or the like). This estimated radius may be compared to an expected value, with any anomalies detected and removed. An error vector may then be derived from these measurements for subsequent sensor transitions and applied to correct prospective trajectory for the wafer. Thus in one aspect a robot handler may gather sensor data during a retract and rotate, and calculate wafer position while gathering additional sensor data during an extend.

Other techniques may be employed for center finding calculations. In one embodiment, a Kalman Filter may be employed using real time encoder updates (for example, at 2 kHz, every 0.5 milliseconds, every 50 milliseconds, or any other suitable frequency or time increments), along with time data for each sensor transition event.

Figure 4:
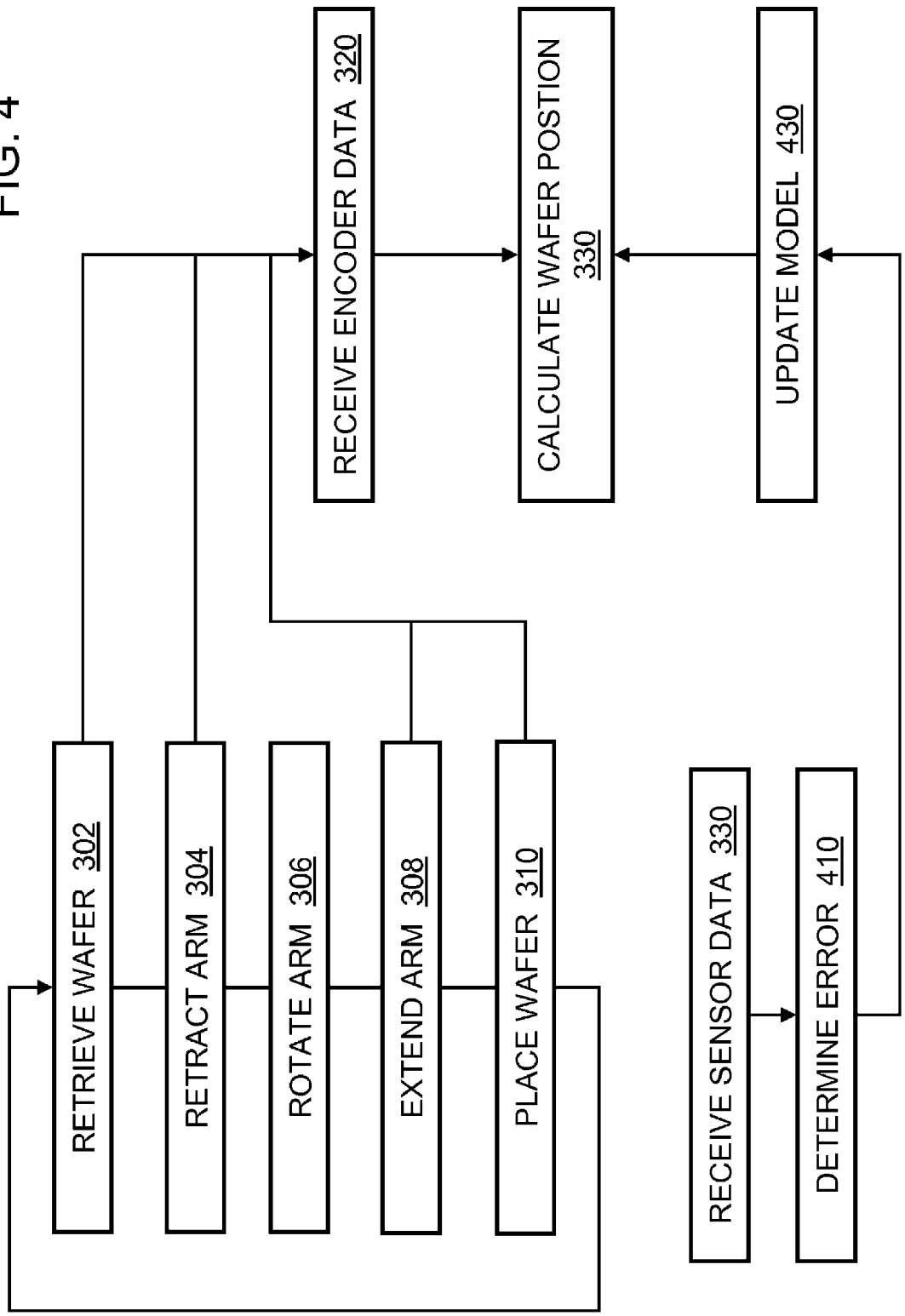
FIG. 4 illustrates a wafer center finding process using a Kalman Filter.

FIG. 4 depicts a wafer center finding method employing a Kalman Filter. In general, calculating a wafer position, as shown in step 330 may be performed using a Kalman Filter that apply encoder data to determine wafer position and/or predict sensor transitions. However, as a variation to the general method depicted in FIG. 3, the (center-finding) Kalman model may be updated periodically. More specifically, sensor data may be received at each sensor transition that includes a time of the transition and, as appropriate, an identity and/or location of the sensor, as illustrated in step 330. Based upon this data, an error may be calculated between an expected transition time for the location and the measured transition time, as depicted in step 410. This error data may then be employed to update the Kalman Filter for more accurate, subsequent estimations, as depicted in step 420. Thus in general encoder data is employed to provide wafer center data for control of the robotic arm, while actual detected transitions may be employed to update the center-finding model, for example, the equations of an extended Kalman Filter.

By way of example, for a wafer located at a particular position $(X_e, Y_e)$ and traveling at an estimated velocity and acceleration, V, a. the model might predict a sensor triggering at time $t_e$, and the system may identify the actual transition at a time $t_s$. The encoder positions measured at that time, $t_s$ (or optionally, the time stamp) may generate an error expressed as:

$$\delta \equiv t_s - t_e \text{ or } \underline{\delta} \equiv \begin{bmatrix} t \\ x \\ y \end{bmatrix}_s - \begin{bmatrix} t \\ x \\ y \end{bmatrix}_e.$$

Then, extended Kalman filter equations may be used as described for example in Applied Optimal Estimation by Arthur Gelb (MIT Press 1974). An adaptation of the formulation described in Gelb may be briefly stated as a system model:

$\dot{x}(t)=f(x(t),t)+w(t); w(t)\approx N(0,Q(t))$ and a measurement model:

$z_k=h_k(x(t_k))+v_k; k=1, 2, \ldots v_k\approx N(0,R_k)$ with state estimate propagation:

$\dot{\hat{x}}(t)=f(\hat{x}(t),t)$ and error covariance propagation:

$\dot{P}(t)=F(\hat{x}(t),t)P(t)+P(t)F^T(\hat{x}(t),t)+Q(t)$

As a significant advantage, this generalized technique permits use of individual sensor events incrementally, rather than requiring some number of points (such as three) to identify a circular wafer. It will be understood that, while a particular order of steps is implied by FIG. 4, that the depicted operations are repetitively performed during operation of a robotic wafer handler, and that no particular order or timing of steps should be inferred. Nonetheless, it will be generally true in some implementations that encoder data is provided continuously in real time, while transitions that initiate model updates would only occur intermittently as a wafer is moved by the robot. It should also be understood that, while an extended Kalman Filter is one useful technique for converting encoder data into wafer center information, other filters or linear modeling techniques may similarly be applied.

The methods and systems described above are generally applicable to wafer center finding using detection of a wafer at discrete points. It is also possible to employ a number of linear sensors such a linear array of charge coupled devices or a contact image sensor to capture wafer data in linear segments. A number of devices employing linear sensors are described below. In these techniques, center finding may generally be accomplished through direct analysis of image data, rather than inferences drawn from a number of discrete sensor events as with the techniques described above.

Figure 5:
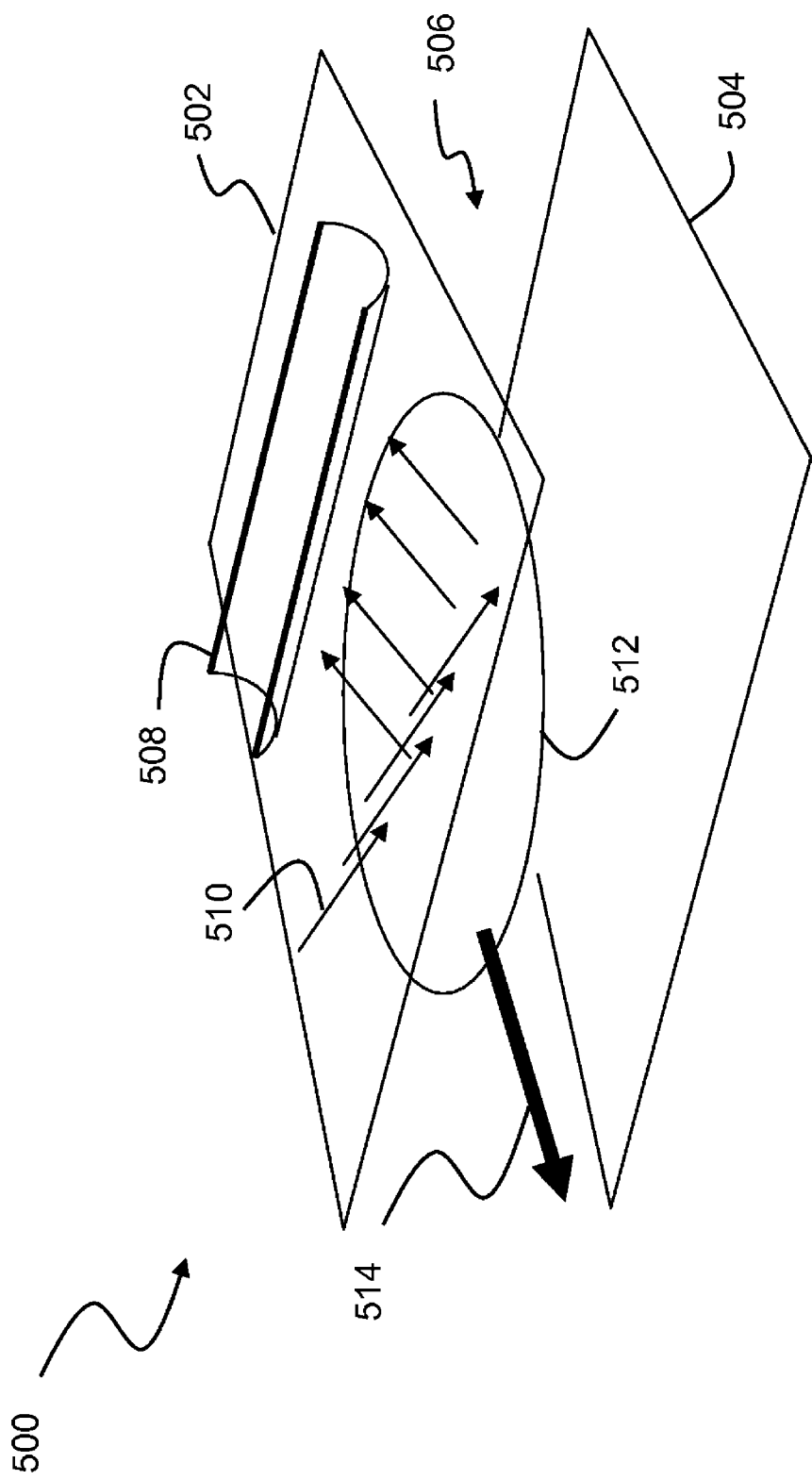
FIG. 5 shows a device with a linear image sensor.

FIG. 5 shows a device with a linear image sensor for capturing image data from passing wafers. The device 500 may include a top surface 502, a bottom surface, 504, an interior 506, a linear image sensor 508, a light source 510, and a wafer 512.

The device 500 may be, for example, any device used in a semiconductor fabrication process such as a load lock, buffer, aligner, robotic handler, or the like. In one embodiment, the device 500 is a robotic handler including a robotic arm (not shown) with an end effector for handling a wafer.

The top surface 502 and bottom surface 504 may partially enclose the interior 506. Although not depicted, it will be understood that the device 500 may also have sides which may, for example, include a number of entrances for passage of wafers, as well as slot valves or other isolation mechanisms for isolating the interior 506 of the device 500. In general, the shape and size of the various surfaces of the device 500 are not important; however, at least one of the surfaces should be parallel to a plane of movement for wafers so that image sensors can be placed thereon to capture image data from wafers moving through the interior 506.

The linear image sensor 508 may be placed on the top surface 502 of the device 500 as depicted, or on the bottom surface of the device. In one embodiment, the linear image sensor 508 may be a contact image sensor. A commercially available contact image sensor generally includes a linear array of detectors (such as charge coupled devices) with an integrated focusing lens and a light source 510, such as LEDs flanked alongside the linear sensor array. While conventional contact image sensors employ red, green, and blue LEDs, or a similar broad spectrum light source, wafers may be suitably imaged for center finding using only a single color source, such as red LEDs. In general, a contact image sensor is placed in close proximity to an object to be scanned. In other embodiments, the linear image sensor 508 includes a linear array of charge coupled devices ("CCDs" or complementary metal oxide semiconductor ("CMOS") optical sensors. The linear array may be a 1-by-n array that includes n sensors (such as 128 sensors, or any other suitable number for spanning some or all of a wafer), a 2-by-n array, or any other suitable one dimensional or two dimensional array. In general, CCDs or CMOS devices may be placed further from an object being imaged and provide greater resolution than current CIS devices. However, they require additional external lighting for good image capture quality. On the other hand, CIS devices are readily available in lengths exceeding the diameter of typical semiconductor wafers, provide an inexpensive alternative for image capture, and provide greater accuracy for pre-packaged arrays. While both technologies are suitable for use with the embodiments described herein with suitable adaptations for some applications, each offers advantages which may make it more suitable for certain uses. Some of these variations are described below, however, as noted above either of these technologies, or other optical technologies, may be usefully employed as linear image sensors 508 as that term is used herein. The linear image sensor 508 has a field of view or measurement volume in which image data may be captured. In general, the linear image sensor 508 may have an operative measurement volume that depends on a number of factors including ambient light, desired accuracy of image, lenses or other optics associated with the sensor, and so forth.

The wafer 512 may be passed through the device 500 in a linear path as indicated by an arrow 514. It will be understood that while a linear path is one possible motion for a wafer, many other motions may be applied by a robotic handler. For example, the wafer may move in a curving path with a rotational movement of a robot, or may move in a discontinuous path formed of a number of different linear and/or curving paths. As will be further discussed below, the wafer may also or instead be rotated about its axis. It will be appreciated that, while the data obtained from such scans can generally be directly analyzed to locate a wafer center and obtain other wafer position data (such as rotational orientation, radius, etc.), that the acquired image data must be coordinated with robot motion using, for example, encoder data or other sensor data, in order to correctly interpret the image data.

Figure 6:
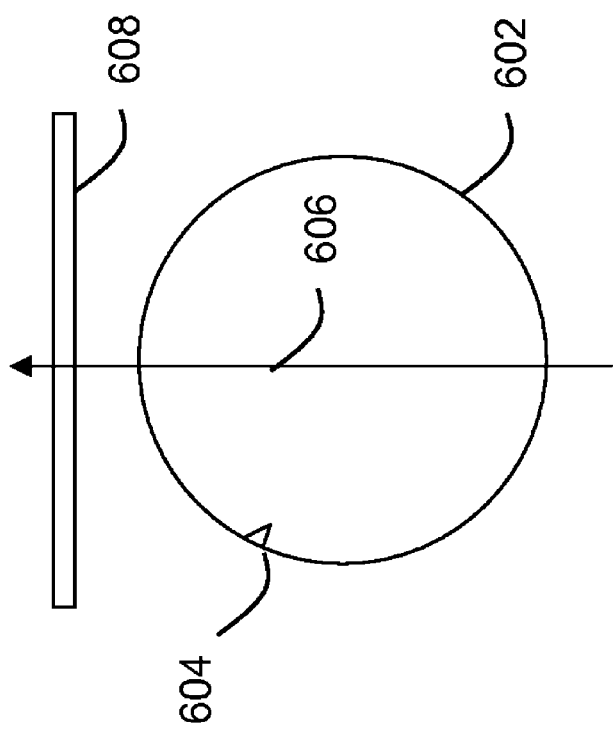
FIG. 6 shows a top view of a contact image sensor used for wafer center finding with a linear wafer motion.

FIG. 6 shows a top view of a contact image sensor used for wafer center finding with a linear wafer motion. Within a device, which may be any of the devices 500 described above, a wafer 602 having an alignment notch 604 may be passed in a linear motion (denoted by an arrow 606) by a single CIS 608 positioned normal to the direction of motion 606. In embodiments, the CIS 608 may include a single module having a length of 310 millimeters, and may be positioned across an entrance to the device to provide full wafer detection, include notch/alignment detection, as the wafer is moved into and out of the device through the entrance. This type of wafer detection provides, in effect, a photocopy of the wafer 602 from which alignment and dimensions may be directly obtained by image analysis. As a significant advantage, this arrangement provides a full wafer scan without requiring any additional robot arm movements or the like. Thus throughput for the transfer device may proceed at a speed that is limited only by robotic and other constraints. In other embodiments, one such CIS 608 may be placed at each of several entrances, for example, at four entrances of a square robotic handler. A single CIS 608 may also, or instead, be positioned to intersect a center of the device. Using a CIS 608 of approximately 450 millimeters, a single CIS may be positioned at a forty-five degree angle to all four entrances and intersecting a center of the device to permit capture of all linear wafer movements through the device. While this arrangement may not capture all wafer dimensional data for all movements through the device, it may nevertheless provide sufficient data for wafer center finding for any possible movement, and additional movements may be provided by a robotic handler to ensure a scan of the entire wafer surface.

Figure 7:
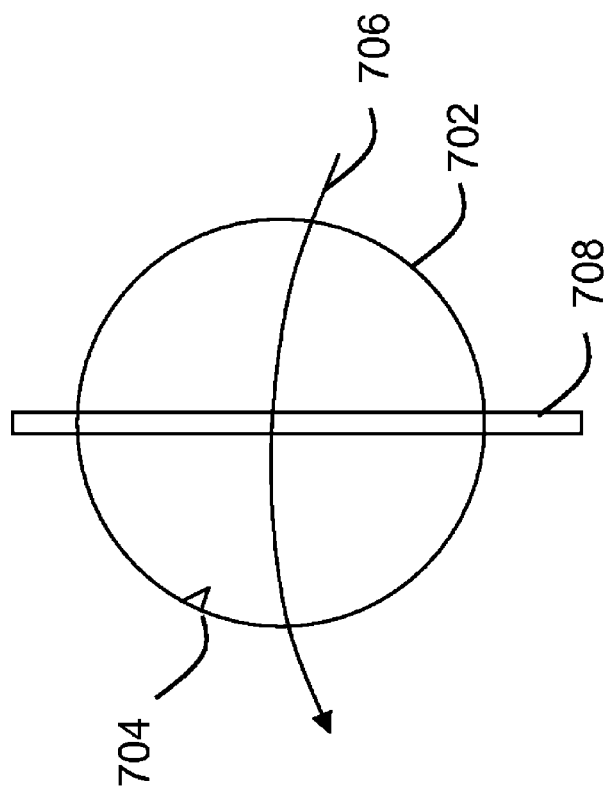
FIG. 7 shows a top view of a contact image sensor used for wafer center finding with a curving wafer motion.

FIG. 7 shows a top view of a contact image sensor used for wafer center finding with a curving wafer motion. Within a device, which may be any of the devices 500 described above, a wafer 702 having an alignment notch 704 may be passed in a curving motion (denoted by an arrow 706) across a single CIS 708. This arrangement may be suitable for positioning at a variety of locations within a robotic handler where the robotic arm employs rotation, although it will be understood that the resulting image data would typically be processed to compensate for the non-linear path 706 taken by the wafer 702.

Figure 8:
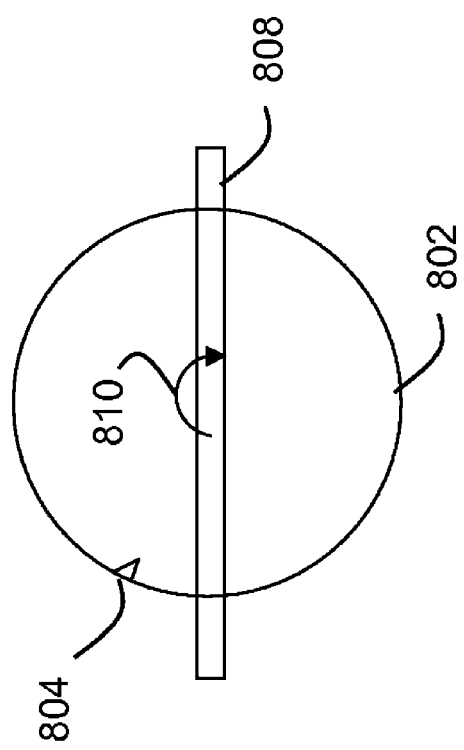
FIG. 8 shows a top view of a contact image sensor used for wafer center finding with a rotating wafer motion.

FIG. 8 shows a top view of a contact image sensor used for wafer center finding with a rotating wafer motion. Within a device, which may be any of the devices 500 described above, a wafer 802 having an alignment notch 804 may be rotated about an axis substantially centered on a CIS 808, as indicated by an arrow 810. In this device, a robotic handler may include z-axis control and a rotating chuck. The robotic handler may position the wafer 802 underneath and centered on the CIS 808, and then optionally lift the wafer 802 into closer proximity to the CIS 808 for more accurate image acquisition. The wafer may then be rotated one hundred and eighty degrees (or more) to obtain a complete image of the wafer 802 including the alignment notch 804. The CIS 808 may be centered within the device, such as at a central axis of an interior of the device, a center axis of a robotic arm inside the device, or a center axis of some other robotic home position within the device. This arrangement advantageously obtains a full scan with a half-turn of the rotating chuck, which may simplify design of the chuck and reduce scanning time. As another advantage, this arrangement can provide a full wafer scan regardless of wafer size (within a limit imposed by the length of the CIS 808). Thus a single system may provide full edge detection for a variety of shapes and sizes.

Figure 9:
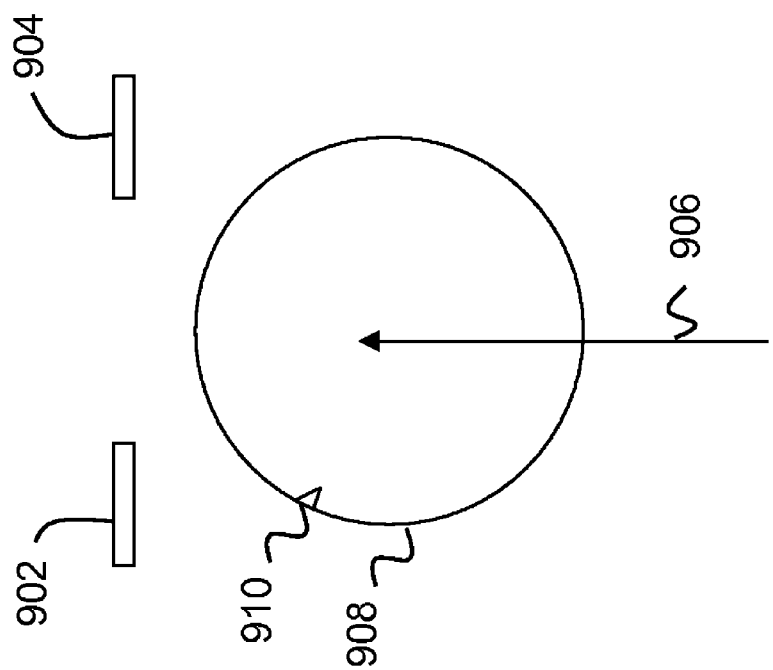
FIG. 9 shows a pair of linear CCD arrays used for wafer center finding with a linear wafer motion.

FIG. 9 shows a pair of linear CCD arrays used for wafer center finding with a linear wafer motion, which may be deployed, for example at an entrance to a device such as any of the devices 500 described above. In this embodiment, a first linear array 902 and a second linear array 904 of CCDs may be provided across a portion of a linear path 906 of a wafer 908. The arrays 920, 904 may be positioned, for example, along the outside edges of an entrance to the device such as a robotic handler in order to capture image data for each wafer passing through the entrance. Similarly, an additional pair of sensor arrays may be positioned at one or more additional entrances to the device. While this configuration advantageously employs short linear arrays of CCDs which are readily commercially available, it also may fail to capture an alignment notch used to determine rotational alignment of the wafer 908.

Figure 10:
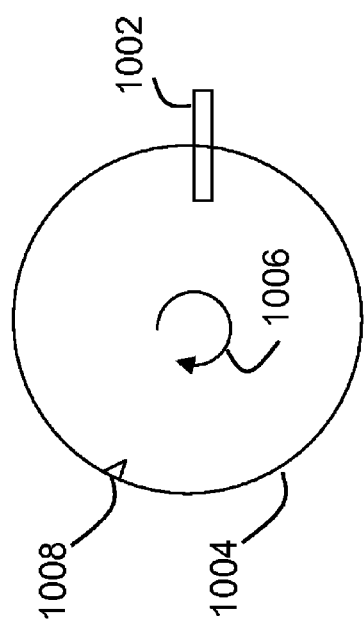
FIG. 10 shows a single CCD array used for wafer center finding with a rotating wafer motion.

FIG. 10 shows a single CCD array used for wafer center finding with a rotating wafer motion. In this embodiment, a single linear CCD array 1002 may be positioned on a lid or other suitable interior surface of a device such as a robotic handler or any of the other devices 500 described above. After a wafer 1004 is suitably positioned under the array 1002, the wafer 1004 may undergo a full rotation as indicated by arrow 1006 so as to capture all edge data for the wafer 1004 including the position of an alignment notch 1008. This embodiment may, for example, employ a robotic handler with z-axis movement and a rotating chuck as described above. However, in this embodiment the rotating chuck preferably rotates at least three-hundred sixty degrees to ensure full capture of edge data. In other embodiments, two collinear arrays may be employed at opposing edges of the wafer 1004 in order to obtain a full edge scan with a half rotation.

Figure 11:
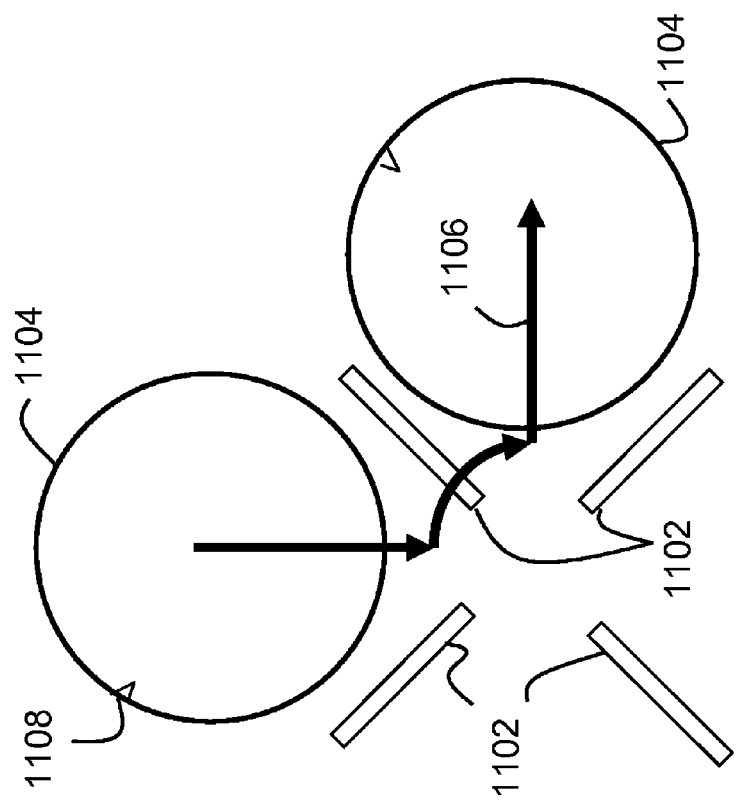
FIG. 11 shows four CCD arrays used for wafer center finding with a compound wafer motion.

FIG. 11 shows four CCD arrays used for wafer center finding with a compound wafer motion. As depicted, a device such as any of the devices 500 described above may include four CCD arrays 1102 arranged in two collinear, intersecting lines, to cover wafer paths in a manner substantially similar to that discussed above with reference to FIG. 1. A wafer 1104 may traverse an interior of the device along a path 1106 that includes straight and curving motions. In one embodiment, the wafer 1104 may be retracted sufficiently toward the center to ensure detection of an alignment notch 1108 at some point during the combined motion of the wafer 11104.

Figure 12:
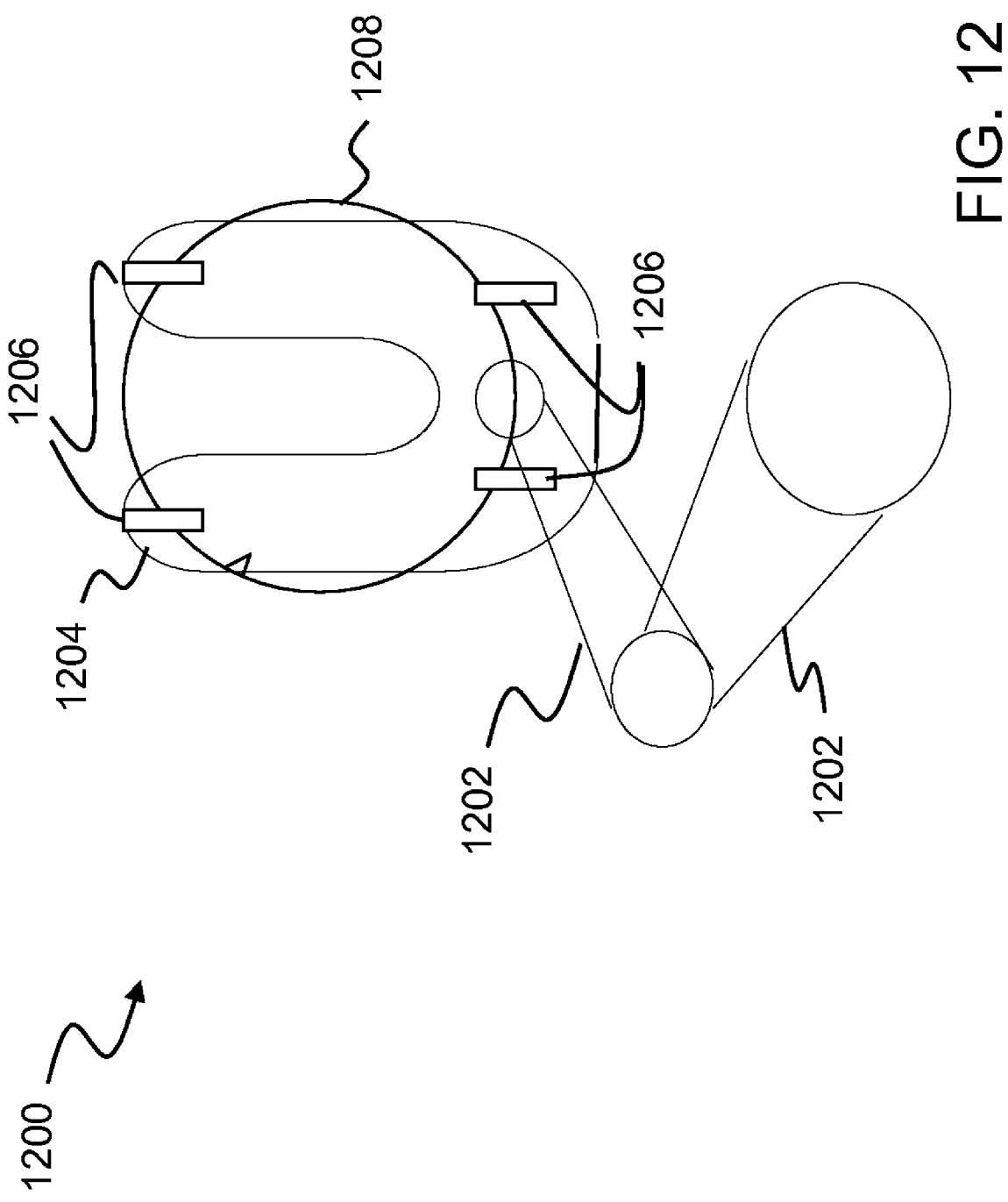
FIG. 12 shows CCD sensors on a robotic arm end effector.

FIG. 12 shows a top view of CCD sensors on a robotic arm end effector. A robotic arm 1200 for wafer handling may include a number of links 1202 and an end effector 1204. The end effector 1204 may include a number of linear CCD arrays 1206 positioned, for example to identify four edge locations of a wafer 1208 positioned thereon. As a significant advantage, this configuration places the wafer 1208 in very close proximity to the linear CCD arrays 1207, which provides very high image accuracy. Further, this design does not require any z-axis or rotational motion by the end effector 1204. It will be apparent from FIG. 12, however, that this configuration may also fail to identify an alignment notch for many rotational orientations of the wafer 1208.

Figure 13:
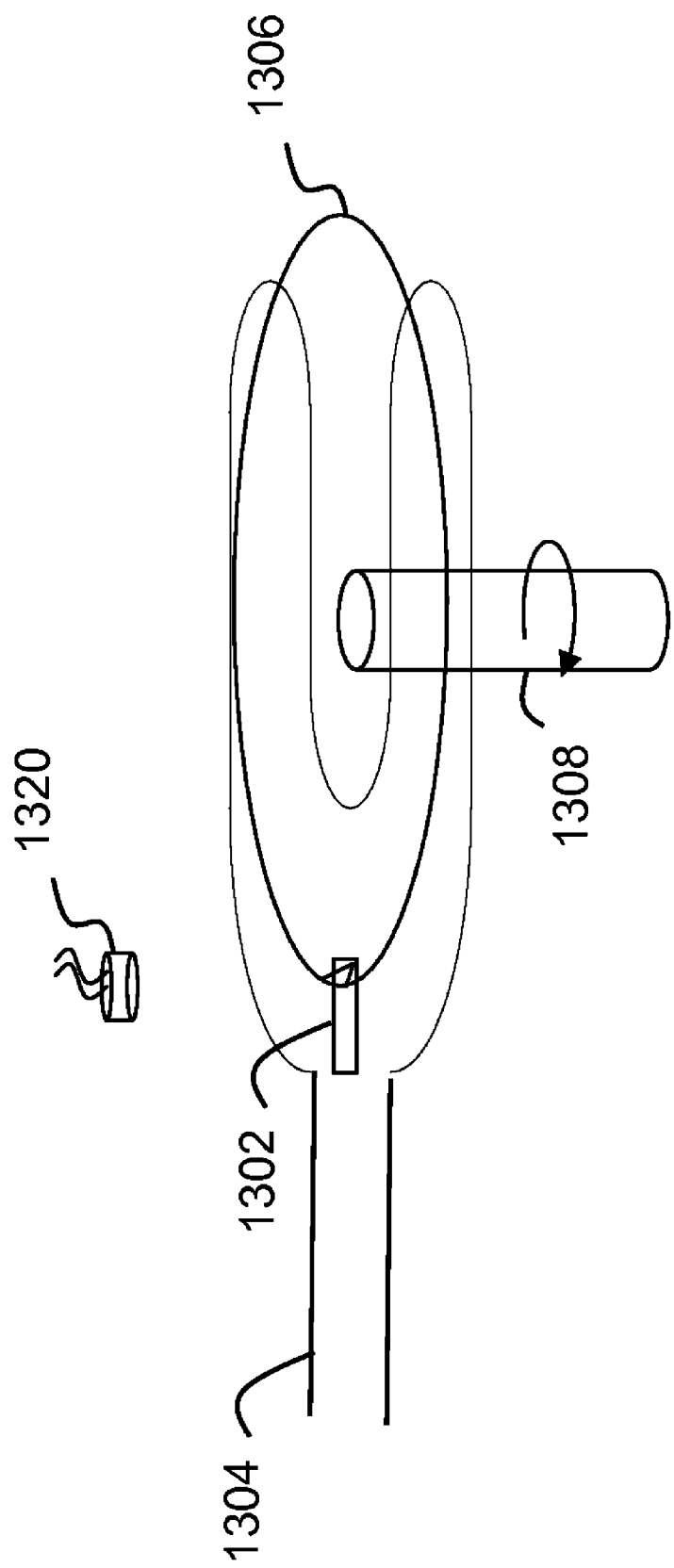
FIG. 13 shows a single CCD sensor on an end effector with a rotating chuck.

FIG. 13 shows a perspective view of single CCD sensor on an end effector with a rotating chuck. In this embodiment, a single linear CCD array 1302 may be mounted on an end effector 1304 at a position to obtain edge data from a wafer 1306 substantially centered on the end effector 1304. The end effector may also include a single axis rotating chuck to rotate the wafer 1306 in a full circle in order to obtain complete edge data from the wafer 1306, including detection of an alignment notch, if any.

A number of external devices 1320 may support use of the CCD array 1302. For example, an external light source may be positioned within the device to illuminate the CCD array 1302 while the end effector 1304 is in certain positions. As another example, a power source may be provided that is inductively coupled to the CCD array 1302 so that the CCD array 1302 is wirelessly powered within the vacuum environment. As another example, a radio frequency or other wireless transceiver may be employed to receive image data wirelessly from the CCD. In such wireless configurations, transceivers, power couplings and the like may be positioned away from the CCD array, such as at a center axis of the robotic arm or some other location that is closer to corresponding wireless systems.

Figure 14:
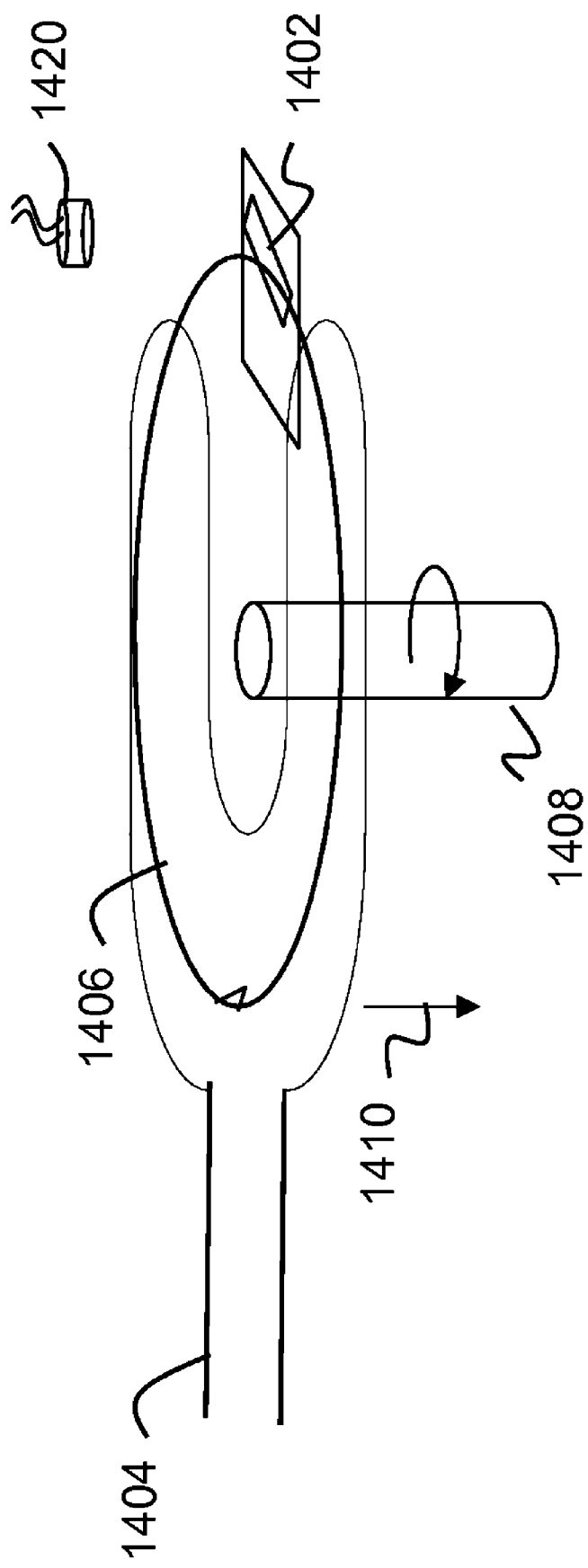
FIG. 14 shows a single CCD in a robotic handling module.

FIG. 14 shows a single CCD sensor in a robotic handling module. In this embodiment, a single linear CCD array 1402 and any associated light sources or other emitters may be mounted on an interior wall of a device such as a robotic handler or any of the other devices 500 described above. In operation, an end effector 1404 may position a wafer 1406 so that the wafer 1406 is centered on a rotating chuck 1408 (separate from the end effector 1404) with an edge above the CCD array 1402. The end effector 1404 may then provide an z-axis motion as indicated by an arrow 1410 to lower the wafer 1406 onto the chuck 1408. The chuck 1408 may then rotate the wafer 1406 in a complete revolution to provide a scan of the entire wafer perimeter. In addition to capturing position data for the wafer 1406, this approach captures rotational orientation of the wafer 1406 by detecting an alignment notch, if any, on the wafer 1406. As in the embodiment of FIG. 13, a device 1420 such as a light source, wireless power coupling, or wireless data transceiver may be positioned within the interior, or where appropriate, on the exterior of the module to enhance operation of the wafer center finding systems described herein.

It will be understood that, while the embodiments described above include sensors within a device such as a load lock, robotic handler, or transfer station (or in certain embodiments, on an end effector), that the above techniques may be deployed at other locations within a fabrication system. For example, any of the above techniques may be suitably adapted for use as an aligner. Similarly, a number of the above techniques may be suitably adapted for use as a measurement station within another device, such as a robotic handler or transfer station. In such embodiments, the measurement station may scan a wafer while a robot performs other wafer movements, such as by providing a space for the measurement station that does not obstruct other entrance or exit paths from the robotic handler, or by performing measurements at a location displaced on the z-axis from other robotic activities.

It will be appreciated that the methods disclosed herein may be realized in hardware, software, any some combination of these suitable for monitoring or controlling a semiconductor manufacturing robotics system. Each process may be realized in one or more microprocessors, microcontrollers, embedded microcontrollers, programmable digital signal processors or other programmable device(s), along with internal and/or external memory. The process(es) may also, or instead, be embodied in an application specific integrated circuit, a programmable gate array, programmable array logic, or any other device or combination of devices that may be configured to process electronic signals. It will further be appreciated that process(es) may be realized as computer executable code created using a structured programming language such as C, an object oriented programming language such as C++, or any other high-level or low-level programming language (including database programming languages and technologies) that may be compiled or interpreted to run on one of the above devices, as well as heterogeneous combinations of processors, processor architectures, or combinations of different hardware and software. All such variations are intended to fall within the scope of this disclosure.

While the invention has been described in connection with certain preferred embodiments, other embodiments may be understood by those of ordinary skill in the art and are encompassed herein.

What is claimed is:

1. A method for finding a center of a wafer in a device having an interior and a plurality of entrances, the interior containing a robotic arm, and the device including a plurality of sensors, each one of the sensors adapted to detect a presence of the wafer at a predetermined location within the interior of the device, the method comprising:
   retrieving the wafer from outside the interior through a first one of the plurality of entrances;
   retracting the wafer into the interior and detecting a presence of the wafer with a first one of the plurality of sensors;
   rotating the robotic arm;
   extending the wafer out of the interior through a second one of the plurality of entrances and detecting an absence of the wafer with the first one of the plurality of sensors; and
   determining a location of a center of the wafer relative to the robotic arm using sensor data from the plurality of sensors and position data from the robotic arm.

2. The method of claim 1 wherein the plurality of sensors include optical sensors.

3. The method of claim 2 wherein the plurality of sensors include light emitting diodes.

4. The method of claim 2 wherein the plurality of sensors include auto focusing photodiode detectors.

5. The method of claim 1 wherein determining a location includes applying a Kalman Filter to the position data from the robotic arm.

6. The method of claim 5 further comprising updating the Kalman Filter based upon the sensor data.

7. The method of claim 1 wherein the wafer is substantially circular.

8. The method of claim 1 wherein the wafer includes an alignment notch.

9. The method of claim 1 wherein the plurality of sensors include at least one detector positioned opposite a light emitting diode such that a light path from the light emitting diode to the light detector includes a predetermined position within the interior.

10. The method of claim 1 wherein the plurality of sensors include at least one detector positioned such that light from a light emitting diode, when reflected off of the wafer at a predetermined location, is detected by the detector.

11. The method of claim 1 wherein retracting includes retracting in a linear motion.

12. The method of claim 1 wherein extending includes extending in a linear motion.

13. The method of claim 1 wherein rotating includes rotating about a center axis of the robotic arm.

14. A method for finding a center of a wafer in a device having an interior and a plurality of entrances, the interior containing a robotic arm, and the device including a plurality of sensors, each one of the sensors adapted to detect a presence of the wafer at a predetermined location within the interior of the device, the method comprising:
  retrieving the wafer from outside the interior through a first one of the plurality of entrances;
  retracting the wafer into the interior;
  rotating the robotic arm;
  extending the wafer out of the interior through a second one of the plurality of entrances;
  detecting the presence of the wafer at a predetermined location of at least one sensor during the retracting, rotating, and extending, thereby providing sensor data; and
  determining a location of a center of the wafer relative to the robotic arm using the sensor data and position data from the robotic arm.

15. The method of claim 14 wherein the plurality of sensors include optical sensors.

16. The method of claim 15 wherein the plurality of sensors include light emitting diodes.

17. The method of claim 15 wherein the plurality of sensors include auto focusing photodiode detectors.

18. The method of claim 14 wherein determining a location includes applying a Kalman Filter to the position data from the robotic arm.

19. The method of claim 18 further comprising updating the Kalman Filter based upon the sensor data.

20. The method of claim 14 wherein the wafer is substantially circular.

* * * * *

UNITED STATES PATENT AND TRADEMARK OFFICE
CERTIFICATE OF CORRECTION

| | | |
|---|---|---|
| PATENT NO. | : 7,894,657 B2 | Page 1 of 1 |
| APPLICATION NO. | : 12/032341 | |
| DATED | : February 22, 2011 | |
| INVENTOR(S) | : Peter van der Meulen | |

It is certified that error appears in the above-identified patent and that said Letters Patent is hereby corrected as shown below:

Column 1, line 12, delete "2006" and insert -- 2006, --, therefor.

Signed and Sealed this
Thirteenth Day of September, 2011

David J. Kappos
*Director of the United States Patent and Trademark Office*